(12) United States Patent
Kuppuswamy et al.

(10) Patent No.: US 7,161,873 B2
(45) Date of Patent: Jan. 9, 2007

(54) METHOD OF DETECTING AND LOCATING A SOURCE OF PARTIAL DISCHARGE IN AN ELECTRICAL APPARATUS

(75) Inventors: Raja Kuppuswamy, Paris (FR); Sebastien Louise, Courbevoie (FR); Niemet Nzihou, Lyons (FR)

(73) Assignee: Areva T&D SA, Paris la Defense (FR)

( * ) Notice: Subject to any disclaimer, the term of this patent is extended or adjusted under 35 U.S.C. 154(b) by 0 days.

(21) Appl. No.: 11/088,893

(22) Filed: Mar. 25, 2005

(65) Prior Publication Data

US 2005/0243649 A1    Nov. 3, 2005

(30) Foreign Application Priority Data

Apr. 13, 2004    (FR) ................... 04 50729

(51) Int. Cl.
*G01S 1/80* (2006.01)
*G01S 5/18* (2006.01)
*G01R 31/08* (2006.01)

(52) U.S. Cl. ............ 367/129; 367/118; 367/907; 324/536; 324/547

(58) Field of Classification Search ........ 367/118, 367/129, 907; 324/536, 547
See application file for complete search history.

(56) References Cited

U.S. PATENT DOCUMENTS

| | | | | |
|---|---|---|---|---|
| 3,505,597 A | * | 4/1970 | Cronin et al. | 367/129 |
| 3,622,872 A | * | 11/1971 | Boaz | 324/536 |
| 3,728,619 A | * | 4/1973 | Harrold et al. | 367/120 |
| 3,985,024 A | * | 10/1976 | Horak | 367/907 |
| 4,009,463 A | * | 2/1977 | Vercellotti et al. | 367/129 |
| 4,095,173 A | * | 6/1978 | Darrel | 324/535 |
| 4,231,258 A | * | 11/1980 | Menju et al. | 73/572 |
| 4,592,034 A | * | 5/1986 | Sachse et al. | 367/129 |
| H000536 H | * | 10/1988 | Strickland et al. | 324/456 |
| 5,528,557 A | * | 6/1996 | Horn | 367/129 |
| 5,530,366 A | * | 6/1996 | Nasrallah | 324/547 |

(Continued)

FOREIGN PATENT DOCUMENTS

WO    WO 96/18112    6/1996

OTHER PUBLICATIONS

Phung, et al. "Acoustic Measurements of Partial Discharge Signals." 2000.*

*Primary Examiner*—Jack Keith
*Assistant Examiner*—Scott A. Hughes
(74) *Attorney, Agent, or Firm*—Oblon, Spivak, McClelland, Maier & Neustadt, P.C.

(57) ABSTRACT

A method of detecting and localizing a source of partial discharge in an electrical apparatus placed in an enclosure containing an acoustically-conductive fluid. The method consists in:
  positioning (31) acoustic detectors and acquiring the positions of the detectors;
  defining (35) groups of detectors, each group including at least three detectors;
  ensuring (37) that each group is free from any triangle having vertices embodied by three detectors in which at least one angle lies outside a range of angles, and otherwise eliminating the group;
  for each non-eliminated group, calculating (38) an approximate position for the source;
  ensuring (39) that each non-eliminated group is free from any triangle having vertices embodied by two detectors of the group and by the approximate position, including at least one angle that lies outside the range, and otherwise eliminating the group; and
  calculating (43) the looked-for position of the source by averaging the approximate positions of all or some of the non-eliminated groups.

14 Claims, 12 Drawing Sheets

U.S. PATENT DOCUMENTS 5,583,828 A * 12/1996 Arai et al. .................. 367/118
5,612,930 A * 3/1997 Hazony et al. ............. 367/140
6,065,342 A * 5/2000 Kerr et al. .................. 367/127
6,323,655 B1 * 11/2001 Fu et al. ..................... 324/536
6,340,890 B1 * 1/2002 Bengtsson et al. .......... 324/536

* cited by examiner

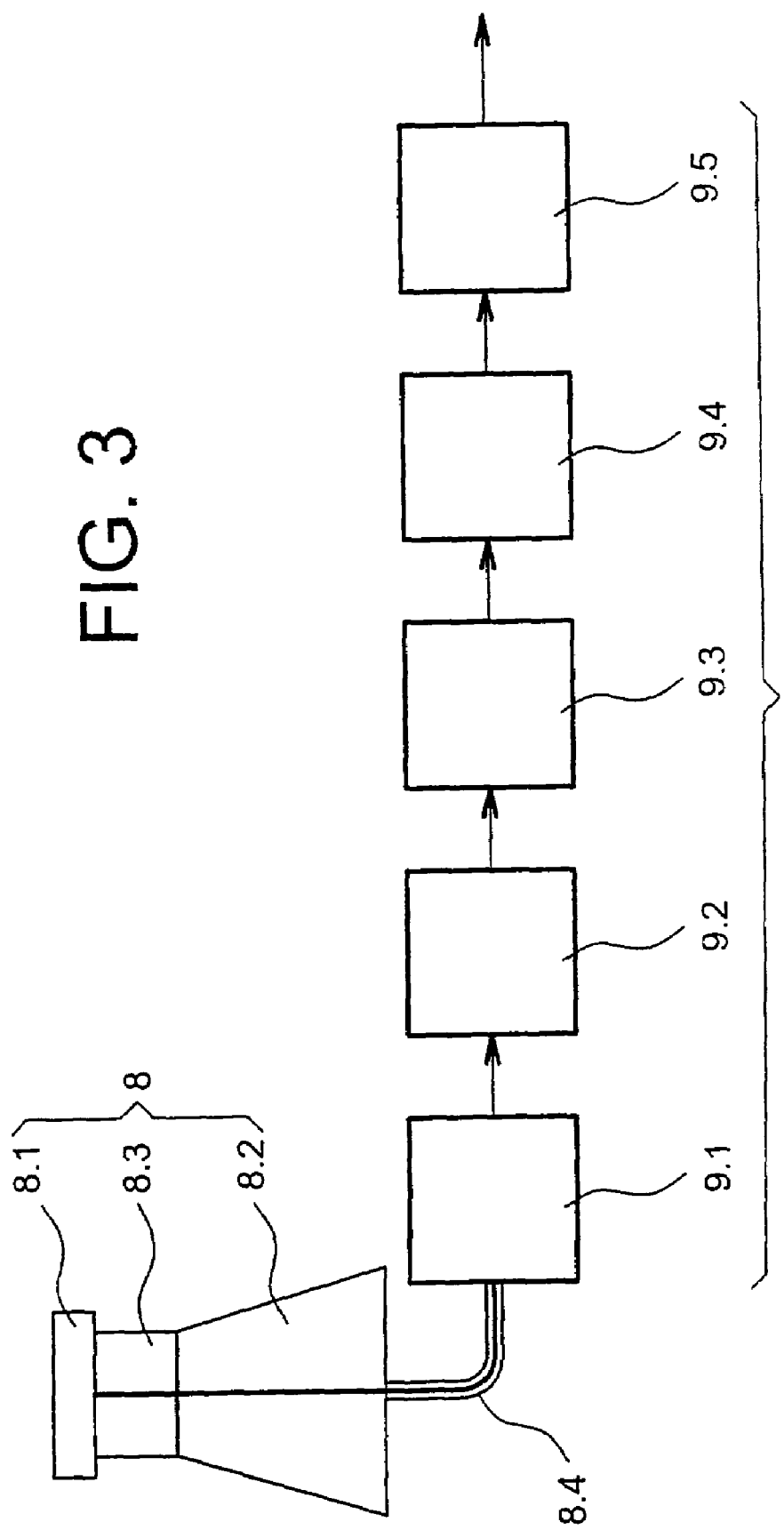

| | | x | y | z |
|---|---|---|---|---|
| 8 | 3,6,53 | 54 | -391 | -1443 |
| 9 | 3,6,82 | 69 | -384 | -1496 |
| 13 | 5,6,53 | 45 | -410 | -1457 |
| 15 | 5,8,82 | 36 | -435 | -1545 |
| 16 | 5,53,82 | 129 | -419 | -1457 |
| 17 | 6,8,53 | 24 | -469 | -1498 |
| 18 | 6,8,82 | 44 | -453 | -1545 |

| | | | |
|---|---|---|---|
| | 57,3 | -423,0 | -1491,6 |
| $\sigma x$ | 34,6 | | |
| $\sigma y$ | 30,6 | | |
| $\sigma z$ | 44,0 | | |
| SEP | 56,0 | | |

| | | x | y | z |
|---|---|---|---|---|
| 1 | 1,3,5 | -21 | -387 | -1200 |
| 2 | 1,3,6 | 29 | -415 | -1255 |
| 3 | 1,5,82 | 172 | -417 | -1414 |
| 4 | 1,6,53 | 97 | -309 | -1375 |
| 5 | 1,6,82 | 117 | -287 | -1402 |
| 8 | 3,6,53 | 54 | -391 | -1443 |
| 9 | 3,6,82 | 69 | -384 | -1496 |
| 13 | 5,6,53 | 45 | -410 | -1457 |
| 15 | 5,8,82 | 36 | -435 | -1545 |
| 16 | 5,53,82 | 129 | -419 | -1457 |
| 17 | 6,8,53 | 24 | -469 | -1545 |
| 18 | 6,8,82 | 44 | -453 | -1547 |
| | | 66,3 | -398,0 | -1420,5 |
| σx | | 53,5 | | |
| σy | | 55,8 | | |
| σz | | 56,5 | | |
| SEP | | 85,1 | | |

FIG. 9

| | | x | y | z |
|---|---|---|---|---|
| 1 | 1,3,5 | -21 | -387 | -1200 |
| 2 | 1,3,6 | 29 | -415 | -1255 |
| 3 | 1,5,82 | 172 | -417 | -1414 |
| 4 | 1,6,53 | 97 | -309 | -1375 |
| 5 | 1,6,82 | 117 | -287 | -1402 |
| 6 | 1,52,53 | 121 | -334 | -1393 |
| 7 | 1,52,82 | 132 | -323 | -1407 |
| 8 | 3,6,53 | 54 | -391 | -1443 |
| 9 | 3,6,82 | 69 | -384 | -1496 |
| 10 | 3,52,53 | -56 | -327 | -1393 |
| 11 | 3,52,82 | 368 | -583 | -1236 |
| 12 | 5,6,52 | 43 | -389 | -1324 |
| 13 | 5,6,53 | 45 | -410 | -1457 |
| 14 | 5,8,52 | -151 | -401 | -1324 |
| 15 | 5,8,82 | 36 | -435 | -1545 |
| 16 | 5,53,82 | 129 | -419 | -1457 |
| 17 | 6,8,53 | 24 | -469 | -1498 |
| 18 | 6,8,82 | 44 | -453 | -1545 |
| 19 | 6,52,53 | 85 | -329 | -1393 |
| 20 | 6,52,82 | 106 | -306 | -1424 |
| | | 72,2 | -388,4 | -1399,1 |
| σx | | 101,0 | | |
| σy | | 71,4 | | |
| σz | | 78,0 | | |
| SEP | | 128,4 | | |

FIG. 7

| | | 950-455-815 | 950-455-815 | 910-467-670 |
|---|---|---|---|---|
| | | | 0 | 150,8940025 |
| | 950-450-815 | 949-484-855 | 948-466-821 | 846-483-601 |
| | | 49,165964 | 12,68857754 | 239,574623 |

METHOD OF DETECTING AND LOCATING A SOURCE OF PARTIAL DISCHARGE IN AN ELECTRICAL APPARATUS

TECHNICAL FIELD

The present invention relates to a method of detecting and locating a source of partial discharge in an electrical apparatus such as a transformer. This method, for use during maintenance tests, for example, serves to detect and locate any source of partial discharge in the electrical apparatus simply, quickly, and accurately. The manufacturers of such electrical apparatuses and their users regularly check for the appearance of partial discharges, since they are the cause of apparatus malfunctions and can lead to destruction of the apparatus.

STATE OF THE PRIOR ART

Partial discharges relate to electrical charge being emitted inside the electrical apparatus due to a fault in its electrical insulation. The electrical apparatus lies within an enclosure containing a fluid that conducts sound. For a high voltage transformer, its windings are generally insulated with paper that has been impregnated in a dielectric fluid such as oil. Other transformers are of the dry type, being surrounded by air or some other dielectric gas.

The defect may be due to a breakdown in the transformer insulation. Another cause might be the presence of contamination in the liquid or a bubble of gas such as air, and a conductive path may appear and a spark may be triggered without leading to an electric arc being established, which is why the term "partial" discharge is used.

It is known that partial discharges in high voltage electrical apparatuses, such as large power transformers, are associated with high frequency or ultra-high frequency waves being emitted together with sound waves (generally ultrasound waves) which propagate in the acoustically-conductive fluid. It is thus known to detect and to seek to locate such sources of partial discharge by means of acoustic detectors, possibly associated with electrical detection means for detecting high frequency or ultrahigh frequency waves.

The highest frequencies may reach approximately 2 gigahertz (GHz) if the dielectric fluid is a gas, and approximately 1.5 GHz if the dielectric fluid is a liquid.

Two detection and localization methods are described, for example in the article [1], it being understood that bibliographical references are listed at the end of the present description.

In the first method, an acoustic detector is placed in succession at a plurality of locations at the outside wall of the enclosure. In each of these positions, the instant of the emission of a partial discharge is determined electrically and a measurement is made of the time taken by the sound wave that is emitted by the partial discharge to be detected by the acoustic detector. It is assumed that the sound wave propagates linearly through the dielectric fluid at a known speed (e.g. about 1400 meters per second (m/s) for oil at ambient temperature). The distance between the source of partial discharge and the acoustic detector can then be calculated. With at least three positions for the acoustic detector, it is possible by triangulation to determine the coordinates of the source of the partial discharge. That method is explained in the document referenced [2].

In the second method, at least one pair of acoustic detectors is used simultaneously and a measurement is made of the time difference taken by an acoustic wave to travel the distance between the source of partial discharge and each of the detectors in the pair. Knowing the positions of the acoustic detectors, a first hyperboloid is defined on which the source of partial discharge is to be found. Using another pair of acoustic detectors or by moving the first pair of detectors, a second hyperboloid is defined in the same manner, with the source of partial discharge lying at the point of intersection between the two hyperboloids.

In patents [3, 4] an acoustic detector co-operates in the same device with a detector of a high frequency (or ultra-high frequency) signal emitted by the source of partial discharge. The high frequency signal detector acts to determine the instant at which the partial discharge is emitted. The propagation speed of the high frequency signal is close to the speed of light and it is much greater than the propagation speed of the acoustic wave.

In patent [3] three acoustic detectors arranged in an equilateral triangle having a side lying in the range 15 centimeters (cm) to 20 cm are mounted on a common support. That set of three detectors is pressed against the outside wall of the transformer enclosure and it is easier to use than a plurality of separate acoustic detectors.

However, in order to simplify calculations, it is assumed that the time taken by the acoustic wave generated by the source of partial discharge is the same for reaching each of the three acoustic detectors since they are, in fact, close to one another. Measurement accuracy is mediocre. To obtain a small improvement in the accuracy with which the source of partial discharge is located, a plurality of simultaneous measurements can be taken, with a plurality of devices placed at several locations on the enclosure. However the measurement device rapidly becomes very bulky. In a variant, the measurement may be performed in succession by moving the support to a plurality of locations on the enclosure. However a measurement cycle then takes time and the accuracy of localization remains mediocre since the detected signals do not necessarily come from the same source of partial discharge.

Although the approximation described in the above paragraph simplifies calculations, it reduces the accuracy of the localization.

The configuration described in patent [3] requires acoustic detectors to be used on a common surface of the transformer enclosure, and that configuration also requires the acoustic detectors to be arranged close to one another, with the distances between the acoustic detectors being smaller than the distance between each of the acoustic detectors and the looked-for source of partial discharge.

As shown in FIGS. 1A, 1B, 1C, and 1D, the zone of uncertainty 11 (or error zone) in which the source 12 of partial discharge is located is smaller when the straight lines 13 connecting each of the acoustic detectors 14 of a pair to the source of partial discharge 12 form an angle of about 90°. However that is not possible with the arrangement described in patent [3]. In FIG. 1A, the three acoustic detectors 14, seen from the source 12 of partial discharge, are close to one another and the straight lines 13 taken in pairs form angles of less than 90°. The zone of uncertainty 11 is large and substantially ellipsoidal in shape. This zone of uncertainty 11 corresponds substantially to the intersection I in a plane y, z containing the source 12 of partial discharge between the ranges of uncertainties 16 in said plane as associated with each of the acoustic detectors 14. This intersection I is shown in FIG. 1B for two acoustic detectors 14. FIGS. 1C and 1D are similar to FIGS. 1A and 1B with the exception that the acoustic detectors 14 seen from the source 12 of partial discharge are now further apart from one another. The intersection I is much smaller than in the preceding case.

In order to be able to locate the source of partial discharge accurately, the advice given in element 8.0 of the IEEE standard PC57.127/D2.0 of September '03 entitled "Draft guide for the detection and location of acoustic emission from partial discharges in oil-immersed power transformers and reactors" is to use a minimum of six detectors, and preferably nine detectors (three detectors per phase for an apparatus such as a transformer). The arrangement of three detectors suggested in patent [3] is therefore not sufficient. It is therefore necessary to use a plurality of arrangements of three detectors, which makes that method very complicated to use. That is contrary to the fundamental purpose of patent [3] which is to simplify modes of operation and calculation.

Additional elements concerning the types of device used, can be found in documents [4] to [10], whose bibliographical references are likewise given at the end of the description.

SUMMARY OF THE INVENTION

The present invention seeks specifically to propose a method of detecting and locating sources of partial discharge in an electrical apparatus while avoiding the above-mentioned drawbacks.

A particular object is to enable the partial discharge to be located with great accuracy. Accurate knowledge of the site of origin of partial discharges saves time and is therefore less expensive, since it then enables the malfunction of apparatus to be diagnosed more quickly and this makes it easier to determine what action needs to be taken to put the apparatus back into working order.

Another object of the invention is to enable localization to be performed simply in a manner that can be adapted to any type of electrical apparatus. In addition, another object of the invention is to enable localization to be performed quickly.

To achieve this, the present invention proposes using groups of acoustic detectors and verifying firstly that the detectors of the groups embody triangles which satisfy conditions concerning their angles, and to verify secondly that the detectors of the groups associated with a calculated approximate position for the source of partial discharge likewise embody triangles which satisfy conditions concerning their angles.

More precisely, the present invention is a method of detecting and locating a source of partial discharge in an electrical apparatus placed in an enclosure containing an acoustically-conductive fluid. The method comprises the following steps:

positioning against the outside of the enclosure N acoustic detectors suitable for detecting an acoustic wave emitted by the source of partial discharge, and acquiring the positions of the N acoustic detectors;

from the N acoustic detectors, defining P groups of acoustic detectors such as P=Z!/3!(Z−3)!, each group comprising at least three detectors and Z being equal to N or to N−1;

performing a first check to verify that each group is free from any triangle having vertices embodied by three acoustic detectors and in which at least one angle lies outside a predetermined range of angles, and otherwise eliminating the group;

for each group that is not eliminated after the first check, calculating an approximate position for the source of partial discharge from the positions of the acoustic detectors of the group and the instants the acoustic wave emitted by the source of partial discharge is received by each of the detectors of the group;

performing a second check to verify that each group that is not eliminated after the first check is free from any triangle having vertices embodied by two of the detectors of the group and by the approximate position of the source of partial discharge and in which at least one angle lies outside the predetermined range, and otherwise eliminating the group; and calculating the looked-for position of the source of partial discharge by averaging the approximate positions calculated for all or some of the groups that are not eliminated after the second check.

Advantageously, the range of angles may extend from 30° to 151° end values included.

To improve the accuracy of localization, the method may further comprise the following steps:

acquiring the dimensions of the enclosure; and performing an additional check to verify that the approximate position of the source of partial discharge, as calculated for each of the groups that is not eliminated after the second check, lies inside the enclosure of the apparatus, and otherwise eliminating the group.

The additional check may be performed with predetermined tolerance.

In which case, the average is taken using the approximate positions calculated for or some of the groups that are not eliminated after the additional check.

Still for the same purpose, the method may further comprise the following step:

performing a supplementary check seeking to eliminate at least one acoustic detector that has led to at least one approximate position considered as being deviant.

This supplementary check may be performed in two stages. They consist in:

a) in identifying at least one extreme approximate position from amongst the approximate positions for the source of partial discharge as calculated for each of the groups that is not eliminated after the last-performed check;

b) in identifying at least one acoustic detector at the origin of this extreme approximate position and in eliminating any group of acoustic detectors that include the identified acoustic detector; and in repeating steps a) and b) so long as a spherical error probability parameter SEP calculated from the approximate positions for the source of partial discharge from the non-eliminated groups remains greater than a predetermined value.

The SEP parameter is defined by SEP=0.513 $(\sigma_x+\sigma_y+\sigma_z)$ where $\sigma_x$ is the standard deviation long the x-axis for the approximate positions of the source of partial discharge, $\sigma_y$ is the standard deviation along the y-axis of the approximate positions for the source of partial discharge, and where $\sigma_z$ is the standard deviation along the z-axis of the approximate positions for the source of partial discharge.

It can also be envisaged that the method includes a step of applying M acoustic detectors to the outside wall of the enclosure of an electrical apparatus, and selecting amongst the M acoustic detectors, N acoustic detectors suitable for detecting an acoustic wave emitted by the source of partial discharge.

When Z=N, a group is formed from a triplet of acoustic detectors, with the approximate positions being calculated by triangulation, by solving the following system of equations:

$$(x_{Gi}-xi)^2+(y_{Gi}-yi)^2+(z_{Gi}-zi)^2-v^2(ti-t0)^2=0$$

$$(x_{Gi}-xj)^2+(y_{Gi}-yj)^2+(z_{Gi}-zj)^2-v^2(tj-t0)^2=0$$

$$(x_{Gi}-xk)^2+(y_{Gi}-yk)^2+(z_{Gi}-zk)^2-v^2(tk-t0)^2=0$$

in which $x_{Gi}$, $y_{Gi}$, $z_{Gi}$ represent the approximate position of the source of partial discharge, (xi, yi, zi), (xj, yj, zj), (xk, yk, zk) represent the positions of the acoustic detectors of the triplet, t0 represents an instant at which a partial discharge generated by the source is emitted, and ti, tj, tk represent the instants at which the acoustic wave emitted by the partial discharge is picked up by each of the acoustic detectors of the triplet, and v represents the speed of the acoustic wave in the fluid.

The instants of the emission of the partial discharge may be measured by electrical means such as an antenna type detector which co-operates with the enclosure.

When Z=N-1, a group is formed by a quadruplet of acoustic detectors including one acoustic detector that acts as a time reference, the approximate positions being calculated by triangulation by solving the following system of equations:

$$\sqrt{(x_{Gj}-xj)^2+(y_{Gj}-yj)^2+(z_{Gj}-zj)^2} - \sqrt{(x_{Gj}-xi)^2+(y_{Gj}-yi)^2+(z_{Gj}-zi)^2} - v(tj-ti)=0$$

$$\sqrt{(x_{Gj}-xk)^2+(y_{Gj}-yk)^2+(z_{Gj}-zk)^2} - \sqrt{(x_{Gj}-xi)^2+(y_{Gj}-yi)^2+(z_{Gj}-zi)^2} - v(tk-ti)=0$$

$$\sqrt{(x_{Gj}-xl)^2+(y_{Gj}-yl)^2+(z_{Gj}-zl)^2} - \sqrt{(x_{Gj}-xi)^2+(y_{Gj}-yi)^2+(z_{Gj}-zi)^2} - v(tl-ti)=0$$

in which $x_{Gj}$, $y_{Gj}$, $z_{Gj}$ represent the approximate position of the source of partial discharge, (xi, yi, zi), (xj, yj, zj), (xk, yk, zk), (xl, yl, zl) represent the positions of the four acoustic detectors of the quadruplets, ti, tj, tk, tl represent the instants at which the acoustic wave emitted by the partial discharge is received by each of the acoustic detectors of the quadruplet, and v is the speed of the acoustic wave in the fluid.

It is thus possible to localize accurately, quickly, simply, and with flexibility the source of partial discharge without having to use fixed arrangements of detectors and without making simplifications or assumptions concerning the measurements given-by the detectors, given that such simplifications and assumptions lead to inaccuracies.

BRIEF DESCRIPTION OF THE DRAWINGS

The present invention will be better understood on reading the following description of embodiments given purely by way of non-limiting illustration and with reference to the accompanying drawings, in which:

FIG. 3 shows an example of an antenna type electrical detector and of means for acquiring and processing the signal delivered by the antenna type detector;

FIG. 7 shows the approximate position for the source of partial discharge seen from twenty groups of acoustic detectors, and also the parameter SEP;

FIG. 9 shows the approximate positions of the source of partial discharge as seen by the groups of detectors in FIG. 7, not including the detector No. 52, and also showing the parameter SEP;

FIG. 11 is a table making comparisons between the positions of the sources of partial discharge as simulated and as obtained experimentally by two variants of the method of the invention and by a conventional method.

Portions which are identical, similar, or equivalent in the various figures described below are given the same numerical references so as to facilitate going from one figure to another.

The various portions shown in the figures are not necessarily to the same scale, in order to make the figures more readable.

DETAILED DESCRIPTION OF PARTICULAR EMBODIMENTS

Figure 1A:
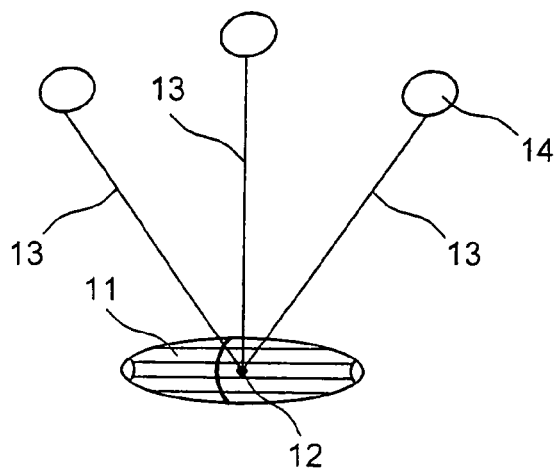
FIGS. 1A to 1D (described above) show why the zone of uncertainty concerning the position of the source of partial discharge is large when the distance between two acoustic detectors is smaller than the distance between each of said acoustic detectors and the source of partial discharge.
Figure 1B:
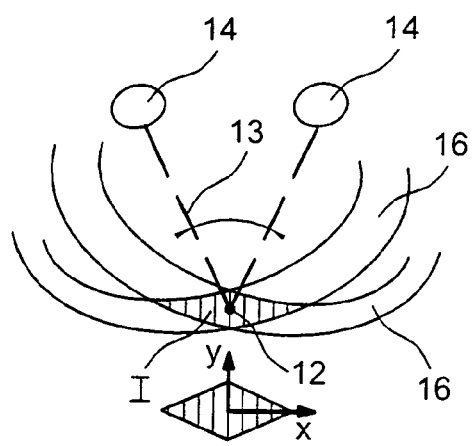
Figure 1C:
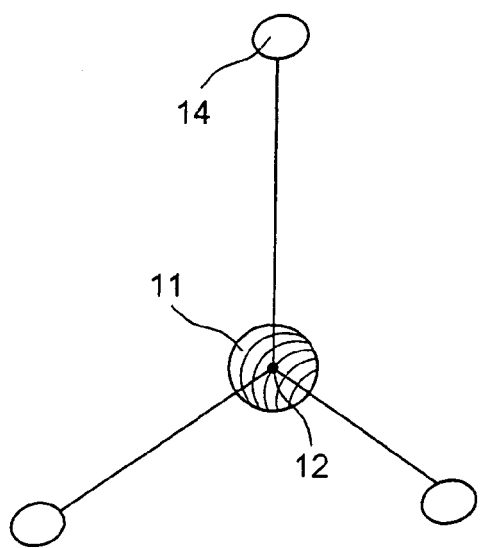
Figure 1D:
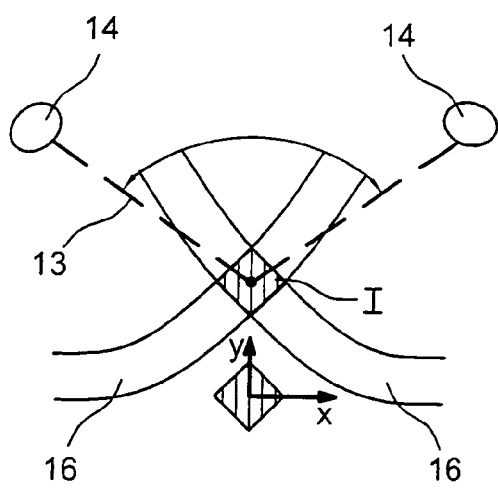
Figure 2:
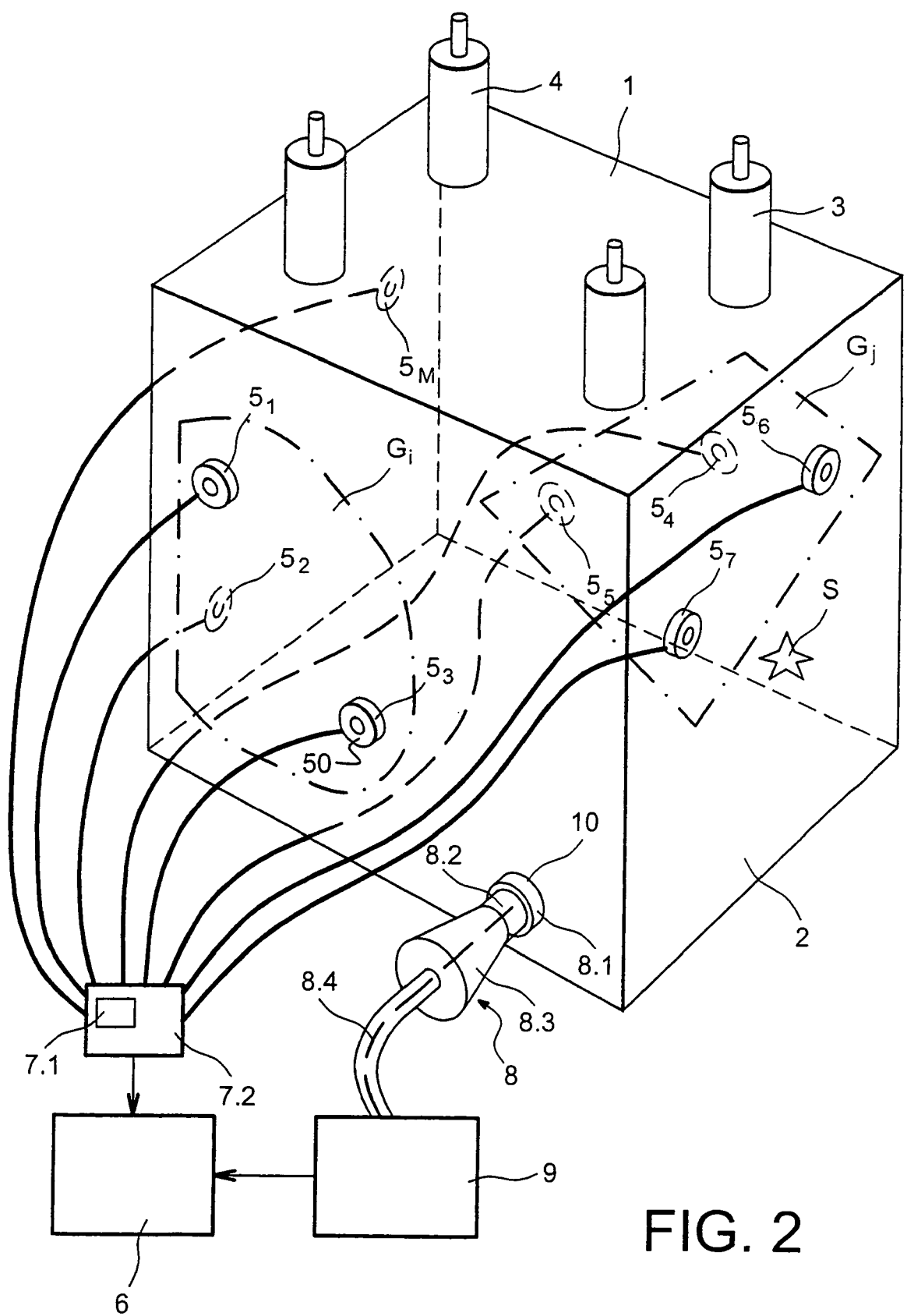
FIG. 2 shows an example of apparatus for implementing the method of the invention.

Reference is made to FIG. 2 which shows an example of apparatus used for implementing the method of the invention for detecting and localizing a source of partial discharge in an electrical apparatus. It is assumed that the electrical apparatus is a high voltage transformer and that it is live. The transformer comprises windings and cores which are not shown so as to avoid cluttering the figure, and which are located inside an enclosure 1. The enclosure 1 is made of an acoustically-conductive material such as steel sheet.

In addition to the electrical apparatus, the enclosure 1 contains an acoustically-conductive medium 2. The acoustically-conductive medium 2 may be oil or some other fluid. The medium 2 serves to insulate the conductors of the windings electrically from one another. It may also serve to cool said windings.

The enclosure 1 is fitted with high voltage feedthroughs 3 and low voltage feedthroughs 4. The apparatus for detecting and localizing a source S of partial discharge comprises a plurality of acoustic detectors $5_1$, $5_2$, $5_3$, ..., $5_M$ distributed over the outside wall of the enclosure 1. These acoustic detectors $5_1$, $5_2$, $5_3$, ..., $5_M$ may be mounted on a support 50 and held against the outside wall of the enclosure 1 with the help of at least one magnet (not shown) secured to the support 50. The acoustic detectors $5_1$, $5_2$, $5_3$, ..., $5_M$ are intended to detect acoustic waves generated by the source S of partial discharge and propagating in the acoustically-conductive medium 2. When the acoustic detectors $5_1$, $5_2$, $5_3$, ..., $5_M$ detect an acoustic wave, they deliver a signal. These acoustic detectors $5_1$, $5_2$, $5_3$, ..., $5_M$ may, for example, be of the piezoelectric type, and they may be sensitive to frequencies lying in the range 20 kilohertz (kHz) to 300 kHz, and more particularly in the range 60 kHz to 200 kHz.

The acoustic detectors $5_1$, $5_2$, $5_3$, ..., $5_M$ are electrically connected firstly to power supply means 7.1 and secondly to means 7.2 for acquiring and processing the signals they deliver. The processing to which the signals delivered by the acoustic detectors $5_1, 5_2, 5_3, \ldots, 5_M$ are subjected comprises, for example, filtering and analog-to-digital conversion. In this embodiment, the measuring apparatus also comprises means 8 for electrically detecting a high frequency or ultra-high frequency wave emitted by the source S of partial discharge. Said means may be an antenna type detector 8 as described in the French patent application filed in the name of Alstom of Feb. 27, 2003 under the number 0302388. Such electrical detection means 8 are for detecting the instant t0 at which a partial discharge is emitted by the source S. They serve to trigger acoustic detection, since as soon as a partial discharge is picked up electrically, the acoustic detectors $5_1, 5_2, 5_3, \ldots, 5_M$ are activated. It is then certain that the acoustic waves they are about to detect come from the source S of partial discharge.

The antenna type detector 8 comprises two electrodes 8.1, 8.2 which are spaced apart by a dielectric resonator 8.3 The detail of the antenna type detector 8 is shown in FIG. 3. The antenna type detector 8 is for detecting high frequency or ultra-high frequency waves generated simultaneously by the source S of partial discharge. These high frequency or ultra-high frequency waves propagate at the speed of light so detecting them makes it possible to determine the instant t0 at which a partial discharge is emitted. In response to these waves, the antenna type detector 8 delivers an antenna signal. The antenna type detector 8 is connected by a coaxial cable 8.4 to means 9 for acquiring and processing the antenna signal.

The antenna type detector 8 is placed in a housing 10 applied to the enclosure 1. The housing 10 is situated in a drain valve that is generally provided near the bottom of the enclosure 1 to enable the dielectric fluid to be removed or tests to be performed.

Instead of using a detector of the antenna type, the electrical detection means could make use of an electrical measurement device placed at a capacitive pickup located at the base of the electrical feedthroughs 3 or 4, or indeed a current probe placed around a cable (not shown) connecting the neutral terminal of the transformer 1 to ground or about a cable (not shown) connecting the tank of the apparatus to ground. Such electrical detection means measure the voltage peaks generated by partial discharges.

With reference now to FIG. 3, there can be seen a diagram of an antenna type detector 8 together with the means 9 for acquiring and processing the signal delivered by the antenna type detector 8. The means 9 for acquiring and processing the antenna signal may comprise, connected in cascade from the antenna type detector 8: a frequency-lowering converter 9.1; an amplifier 9.2; a half-wave rectifier 9.3; and an envelope detector circuit 9.4. The frequency-lowering converter 9.1 receives the antenna signal and shifts its frequency from a high frequency range (or an ultra-high frequency range), e.g. lying in the range 200 megahertz (MHz) to 1500 MHz to a lower frequency range, e.g. 200 kHz to 800 kHz. The amplifier 9.2 amplifies the signal delivered by the frequency-lowering converter 9.1. The half-wave rectifier 9.3 eliminates the negative portion of the signal delivered by the amplifier 9.2. The envelope detector circuit 9.4 extracts the envelope of the signal delivered by the half-wave rectifier 9.3.

The signals delivered by the envelope detector circuit 9.4 are then converted into digital signals by an analog-to-digital converter 9.5 prior to being used as the instant t0 at which a partial discharge was emitted, as explained below.

The digital signals from the acoustic detectors $5_1, 5_2, 5_3, \ldots, 5_M$ and the digital signals from the antenna type detector 8 are processed by the method of the invention in calculation means 6, e.g. a calculator, included in the measuring apparatus, or a computer with which the measuring apparatus co-operates. The calculator or computer contains software suitable for implementing the method of the invention.

A first variant of the invention is described below with reference to the flow chart of FIGS. 4A and 4B in association with FIG. 2.

In a second variant described with reference to FIG. 5, the electrical type detection is no longer needed and only the acoustic detectors are used. The measuring apparatus used for this second variant is not specifically illustrated. With reference to FIG. 2, it suffices to ignore the electrical detection means 8 and the means 9 for acquiring and processing the antenna signal.

Initially, it is assumed that M acoustic detectors $5_1, 5_2, 5_3, \ldots, 5_M$ have been put into position against the outside wall of the enclosure of the electrical apparatus (block 31).

It is possible initially to select from said M acoustic detectors, N acoustic detectors which are suitable for picking up acoustic waves coming from a source of partial discharge that is to be located (block 32). N is less or equal to M. Depending on the position of the source S of acoustic discharge within the enclosure 1, it can happen that at least one acoustic detector, e.g. $5_M$, is not suitable for detecting acoustic waves emitted by that source S. The detector might be too far away from the source S of partial discharge or it might be masked by screens inside the transformer tank.

The positions of each of the N acoustic detectors are acquired (block 33), and stored in a memory of the calculation means. In a variant, this acquisition step may relate to all M acoustic detectors prior to selecting the N acoustic detectors that are to be used.

The positions of the acoustic detectors are given by coordinates xi, yi, zi (where i lies in the range 1 to N) for each acoustic detector in an orthonormal frame of reference whose origin is a reference point on the enclosure 1, which enclosure is generally in the form of a rectangular parallelepiped. For example it can be one of the corners of the enclosure 1.

It is also possible to acquire the dimensions of the enclosure (block 34), which dimensions are likewise stored in a memory of the calculation means.

In the block 35, P groups G1 to GP of three acoustic detectors are defined. These groups are triplets. P is an integer equal to N!/3!(N−3). P corresponds to the number of combinations of three acoustic detectors that can be taken from a set of N acoustic detectors.

In block 36, each of the P groups or triplets is selected in succession.

In block 37, a first check is performed concerning a selected triplet Gi (i lying in the range 1 to P). This check consists in verifying whether the triangle defined by the detectors of the selected triplets has all of its angles satisfying a predetermined condition, namely that its angles lie in a predetermined range of angles. This range of angles preferably extends from 30° to 151° (end values included).

If the selected triplet does not satisfy this angle condition, it is eliminated. Thereafter, another triplet is selected (in block 36) and is subjected to this first check. All of the triplets are subjected to this first check.

This first check is thus performed in succession for each of the P triplets. After the first check, it is assumed that there remain only Q triplets G1 to GQ to be taken into consideration, and that P-Q triplets have been eliminated.

Figures 6, 10:
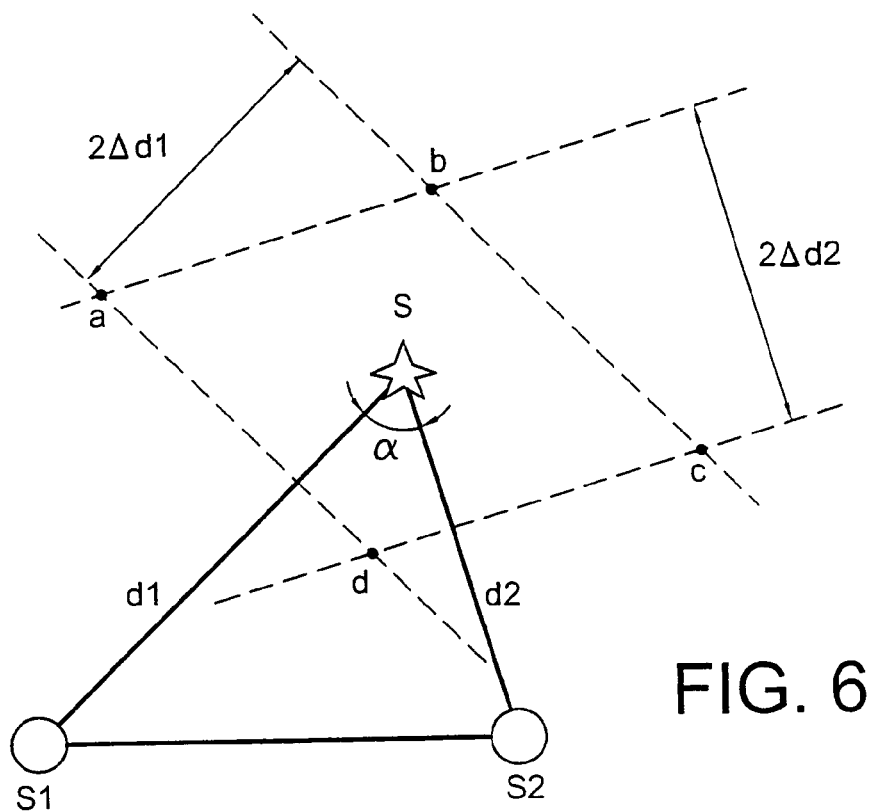
FIG. 6 illustrates the proof that leads to selecting the range of angles.
FIG. 10 gives the approximate positions of the source of partial discharge seen by the groups of detectors in FIG. 9, not including detector No. 1, and also shows the parameter SEP.

There follows an explanation of the significance of this angle condition. Reference is made to FIG. 6.

FIG. 6 shows a first acoustic detector S1 and a second acoustic detector S2 together with a source S of partial discharge. The wall of the enclosure of the electrical apparatus is not shown in order avoid overcrowding the figure. The distance between the first acoustic detector S1 and the source S of partial discharge is d1, and the distance between the second acoustic detector S2 and the source S of partial discharge is d2. The distances d1 and d2 can be determined only to within a certain error $\pm\Delta d1$, $\pm\Delta d2$ respectively. An error zone is embodied by the parallelogram a, b, c, d.

When $\Delta d1=\Delta d2=\Delta d$, as is FIG. 6, the parallelogram a, b, c, d becomes a rhomb.

From the rules of trigonometry:

$$ac=2\Delta d/\cos(\pi/2-\alpha/2) \quad \text{equation (1)}$$

and $$bd=2\Delta d/\sin(\pi/2-\alpha/2) \quad \text{equation (2)}$$

A maximum value $\Delta l$ is set for ac and bd so $ac<\Delta l$ and $bd<\Delta l$.

From equations (1) and (2), the following inequalities are obtained:

$$\Delta d/\Delta l<\cos(\pi/2-\alpha/2) \quad \text{equation (3)}$$

$$\Delta d/\Delta l<\sin(\pi/2-\alpha/2) \quad \text{equation (4)}$$

I.e.:

$\alpha>2\text{arc }\sin(\Delta d/\Delta l)$ $2\text{arc }\sin(\Delta d/\Delta l)<2\text{arc }\cos(\Delta d/\Delta l)$ and thus $2\text{arc }\sin(\Delta d/\Delta l)<\alpha<2\text{arc }\cos(\Delta d/\Delta l)$ if $\alpha 0=2\text{arc }\sin(\Delta d/\Delta l)$ and if $\alpha 1=2\text{arc }\cos(\Delta d/\Delta l)$ then $\alpha 0<\alpha<\alpha 1$ If $\Delta l=4\Delta d$ which is a preferred choice when $\alpha 0=30°$ and $\alpha 1=151°$ and thus $30°<\alpha<151°$, and if, for example, $d1=d2=1.5\pm 0.015$ meters (m), then $\Delta l=0.06$ m.

The accuracy of localization is largely dependent on the first angle value: $\alpha 0$. If $\alpha 0<30°$, accuracy is small, while if $\alpha 0>30°$, accuracy is better. The second angle value $\alpha 1$, should preferably be greater than 90°. However, if it is selected that the angle $\alpha 0>30°$, then the number of points calculated is considerably reduced and that can make localization difficult. Similarly, if it is selected that $\Delta l=2\Delta d$, then $\alpha 0=60°$ so the preceding problem also applies in this case.

When a triplet satisfies the angle condition, i.e. when all of the angles of the triangle embodied by the acoustic detectors lie within the range of angles (including end values), then an approximate position $(x_{Gi}, y_{Gi}, z_{Gi})$ is calculated in block 38 for the source S of partial discharge, as seen by the selected triplet of detectors Gi, on the basis of the positions of the acoustic detectors in the triplet Gi and on the basis of the signals delivered by the antenna type detector 8. More precisely, this consists in solving the following system of equations in three unknowns by optimization:

$$(x_{Gi}-xi)^2+(y_{Gi}-yi)^2+(z_{Gi}-zi)^2-v^2(ti-t0)^2=0$$

$$(x_{Gi}-xj)^2+(y_{Gi}-yj)^2+(z_{Gi}-zj)^2-v^2(tj-t0)^2=0$$

$$(x_{Gi}-xk)^2+(y_{Gi}-yk)^2+(z_{Gi}-zk)^2-v^2(tk-t0)^2=0$$

where:

(xi, yi, zi), (xj, yj, zj), and (xk, yk, zk) represent the positions of the three acoustic detectors of the selected group Gi, v is the speed of the acoustic wave in the fluid, t0 represents the instant at which a partial discharge generated by the source S of partial discharge was emitted, and ti, tj, and tk represent the instants at which the acoustic wave emitted by the partial discharge was received by each of the acoustic detectors of the group Gi.

In block 39, a second check is performed to ensure that each of the Q triplets G1 to GQ, i.e. the triplets that were not eliminated by the first check, does not include any triangle defined by two vertices embodied by any two out of the three acoustic detectors of the triplet and by a third vertex embodied by the approximate position for the source of partial discharge as previously calculated, and having at least one angle lying outside the same predetermined range of angles. If a triplet does not satisfy this angle condition, it is eliminated. At the end of this step, when the Q triplets that were not eliminated in the first check have been subjected to the second check, there remain R triplets where $R \leq Q$.

At this stage, it is possible to save the approximate positions of the source S of partial discharge as calculated from the R triplets that are not eliminated at the end of the second check.

Nevertheless, it is preferable, prior to block 40, to perform an additional check which consists in verifying that the approximate positions of source S of partial discharge as calculated in block 38 for the R triplets that are not eliminated at the end of the second check do indeed all lie within the enclosure 1 of the electrical apparatus. This additional check is performed by making a comparison with the dimensions of the enclosure as acquired in block 34. A certain amount of tolerance may be allowed for, for example having a value of about 20 cm.

A triplet Gi that has led to the source S of partial discharge occupying a position outside the enclosure 1 is eliminated. At the end of this additional check, there remain T triplets of acoustic detectors where $T \leq R$.

This additional check improves the accuracy with which the source of partial discharge is localized.

In this case, the approximate positions for the source S of partial discharge as calculated from the T triplets that are not eliminated at the end of the additional check are saved (block 41). The approximate positions are stored in a memory of the calculation means.

In block 42, a check is performed to determine whether the end of the calculations have been reached, i.e. whether the most recently analyzed group is the last selected group and all the other groups have already been analyzed.

In a variant that is advantageous since it leads to greater precision of localization, it is possible to perform a supplementary check in block 43 oh the set of groups that are not eliminated at the end of the preceding check. This may be constituted by the T groups that are not eliminated at the end of the additional check (block 40) or the R groups that are not eliminated at the end of the second check (block 39) if the additional check is omitted. This supplementary check consists in looking for approximate positions that are deviant and in eliminating those acoustic detectors which contribute to such approximate positions that are considered as being deviant.

It is assumed that the step of block 40 has taken place and that T groups of triplets are present.

This supplementary check (block 43) may consist in performing statistical mathematical processing in two stages.

Figure 4A:
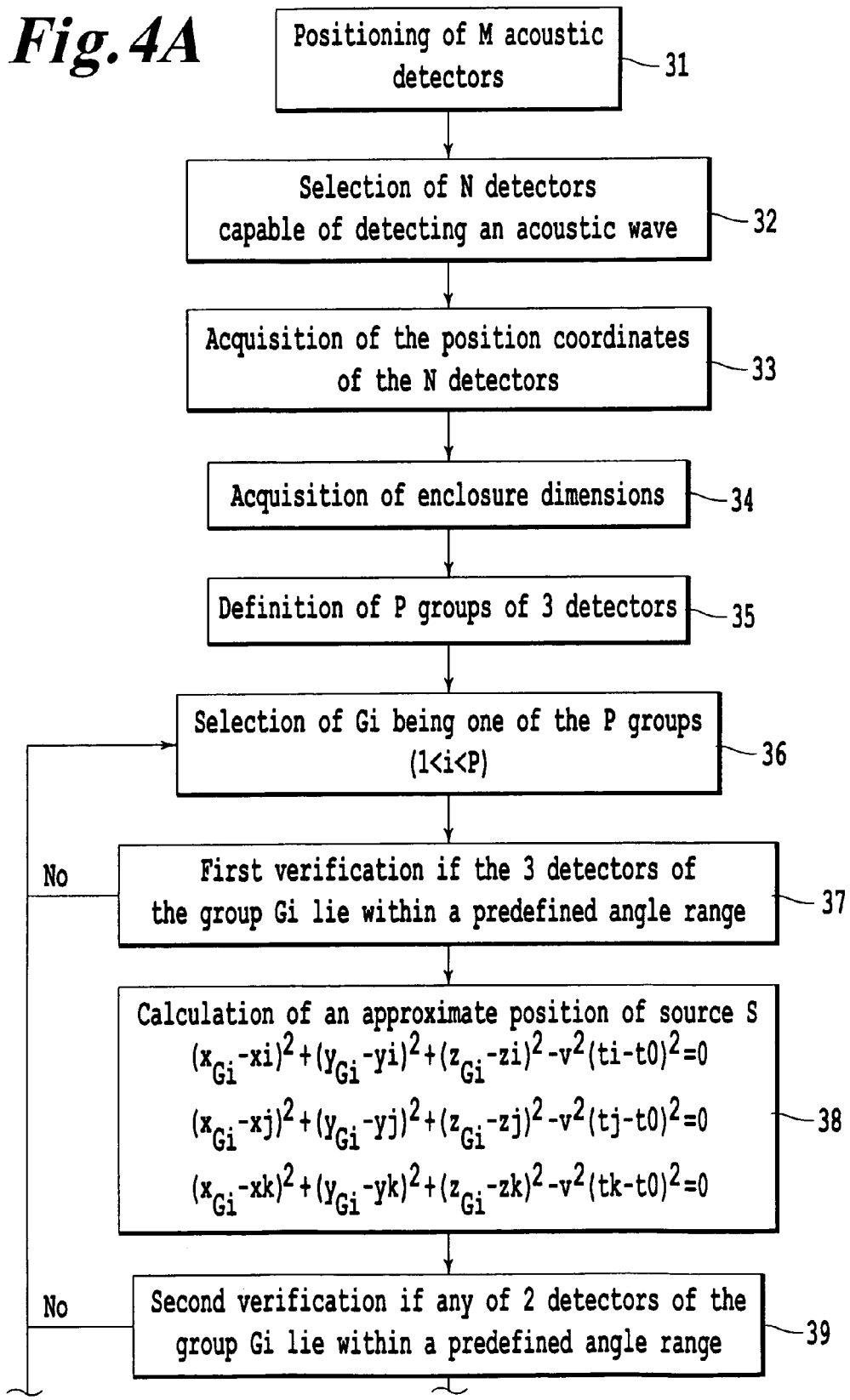
FIGS. 4A to 4B show a flow chart with a first example of the method of the invention.
Figure 4B:
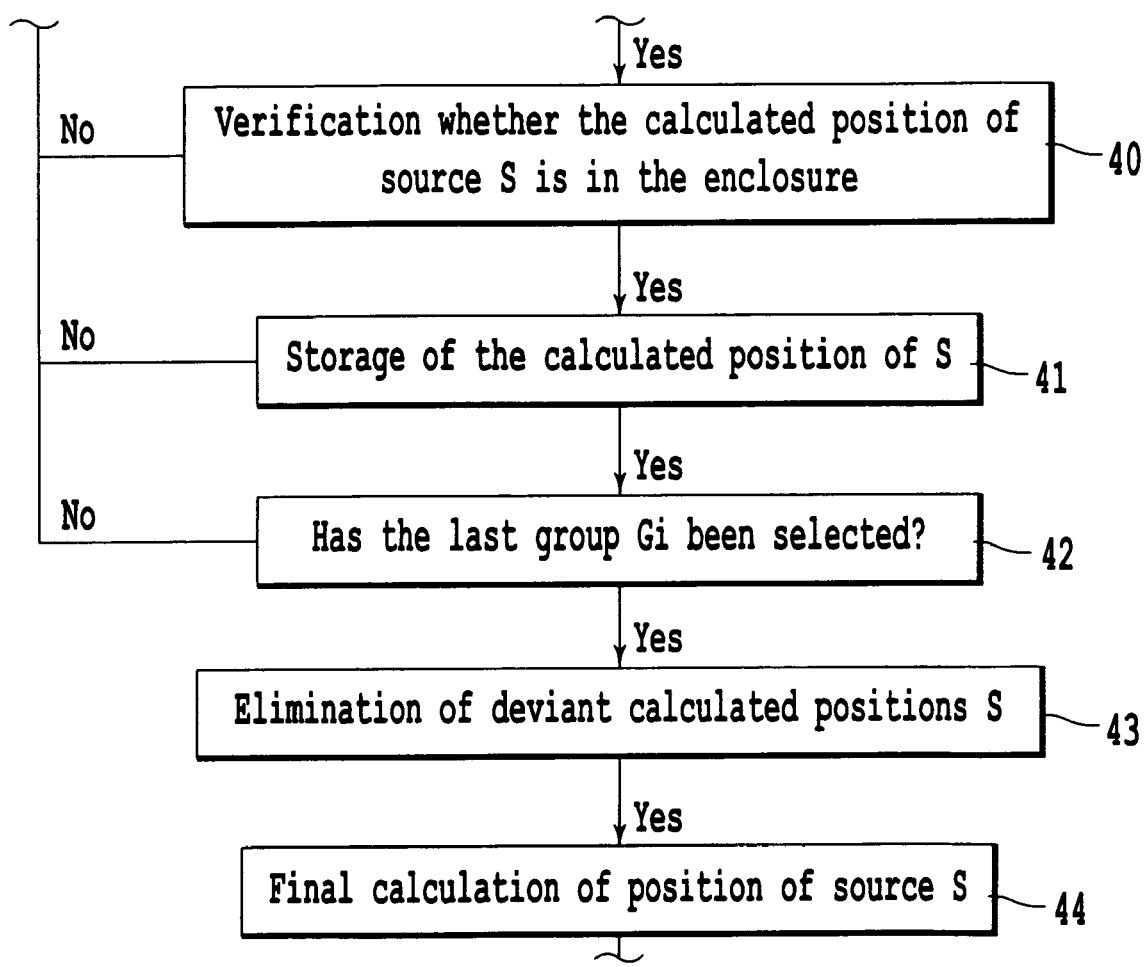
Figure 4C:
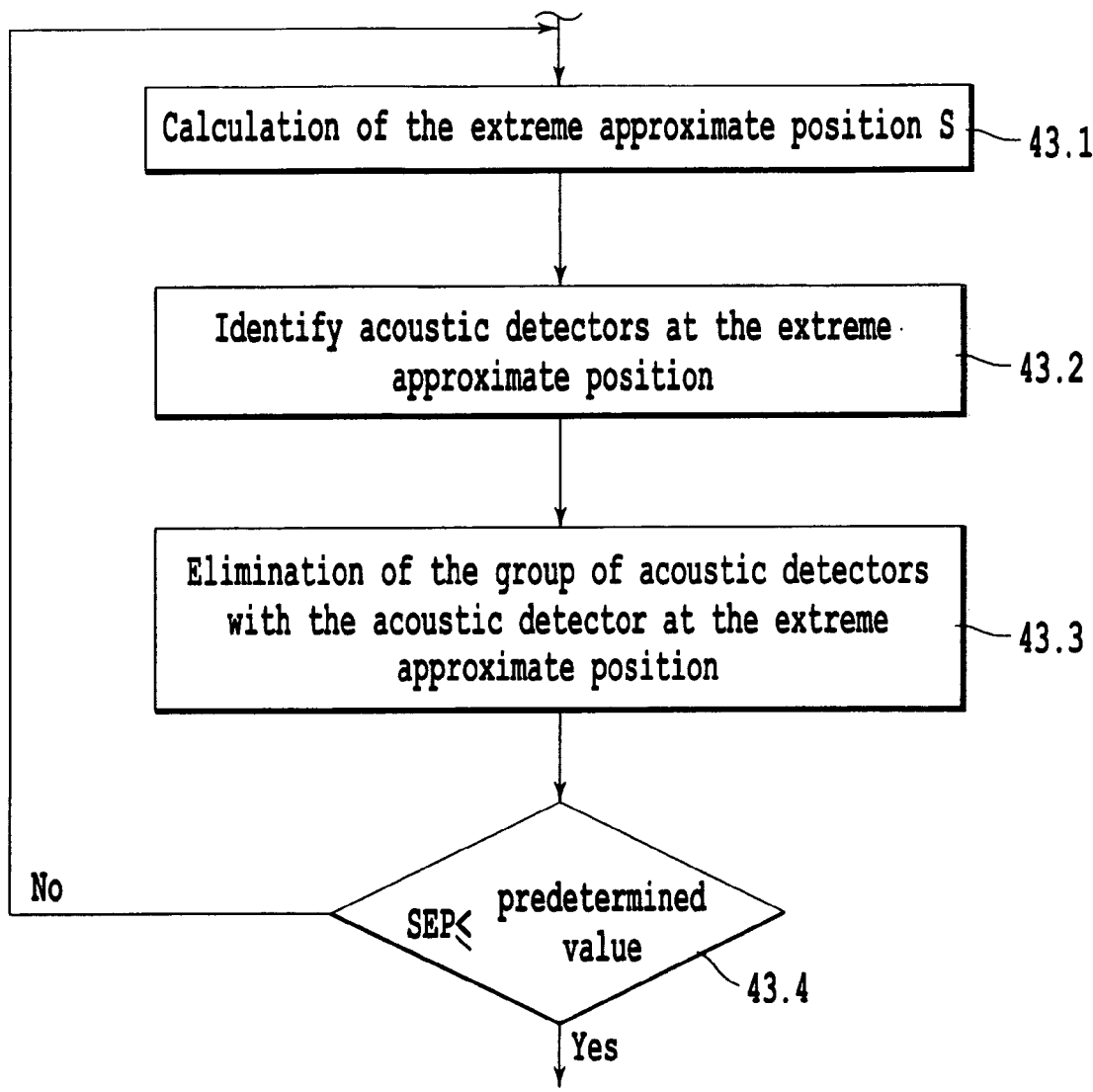
FIG. 4C shows a detail of block 43 shown in FIG. 4B.

These two stages consist:

in identifying amongst the approximate positions for the source of partial discharge, as calculated for each of the groups that are not eliminated after the most recently performed check (in this case for each of the T groups), at least one extreme approximate position (in block 43.1 of FIG. 4C); this position is considered as being deviant; and in identifying at least one acoustic detector at the origin of this extreme approximate position (in block 43.2 of FIG. 4C) and in eliminating all of the groups of acoustic detectors that include the identified acoustic detector responsible for at least one deviant measurement (in block 43.3 of FIG. 4C).

These last two stages are repeated in succession so long as a parameter known as spherical error probability (SEP), calculated on the basis of the approximate positions for the source of partial discharge as seen by the non-eliminated groups and defined by SEP=0.513 ($\sigma_x+\sigma_y+\sigma_z$), where $\sigma_x$ is the standard deviation along the x-axis for the approximate positions of the source of partial discharge, $\sigma_y$ is the standard deviation along the y-axis for the approximate positions of the source of partial discharge, and where $\sigma_z$ is the standard deviation of the z-axis approximate positions for the source of partial discharge, remain greater than a predetermined value (in block 43.4 of FIG. 4C).

This parameter corresponds to an error measurement which expresses overall accuracy in three dimensions. This error measurement represents the radius of a sphere with a position confidence probability of 50%.

In order to identify the extreme approximate position, it is possible, for example, to trace graphs giving the distribution of coordinates along the x, y, and z axes of the approximate positions of the source of partial discharge as seen by each of said T groups. An order number in the range 1 to T is initially given to each of these T groups.

Reference can be made to the table of FIG. 7 which gives the x-axis, y-axis, and z-axis coordinates in millimeters in a Cartesian frame of reference for the approximate positions of the source of partial discharge as seen by T=20 groups of three acoustic detectors. These acoustic detectors are given order numbers and so are each of the groups. These values are obtained from a model of a 220 kilovolt (kV) transformer winding.

Figure 8A:
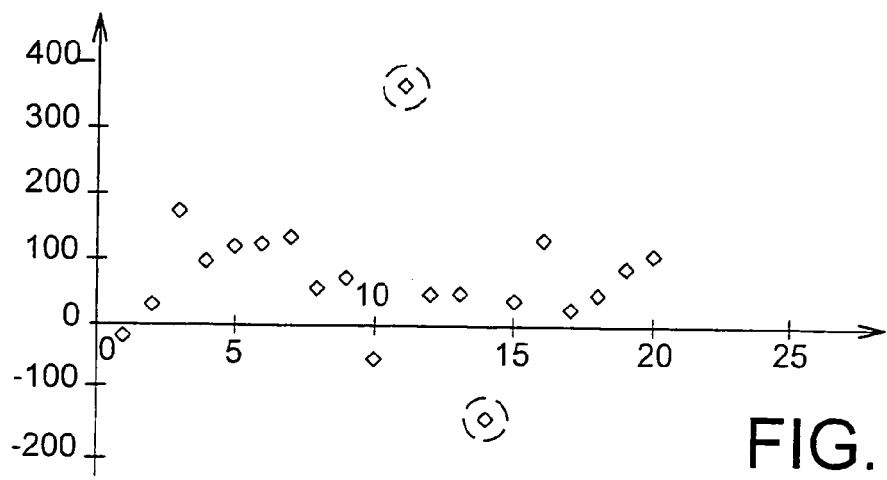
FIGS. 8A, 8B, and BC show respectively the distribution of the abscissa coordinates, the ordinate coordinate, and the z-axis coordinates for the approximate positions seen by the twenty groups of acoustic detectors.
Figure 8B:
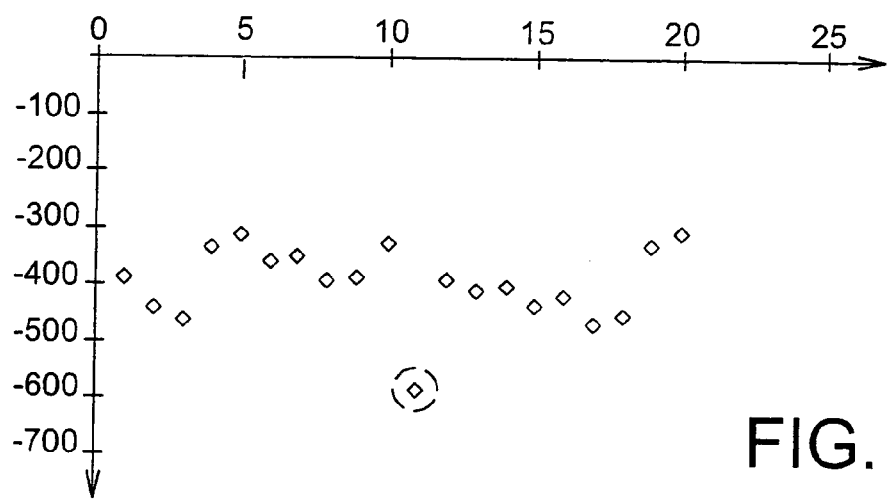
Figure 8C:
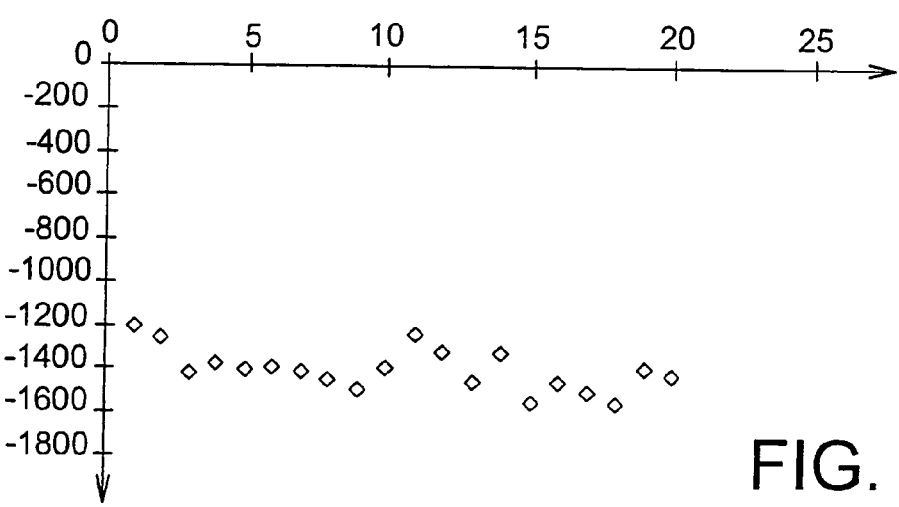

In FIG. 8A, there can be seen the distribution of points along the x-axis for the approximate positions as a function of acoustic detector order number, while FIG. 8B applies to the y-axis, and FIG. 8C to the z-axis.

It can be seen in FIG. 8A that the x-axis position obtained from group No. 11 and that obtained from group No. 14 are deviant. They are extreme, i.e. far away from the center compared with the other x-axis coordinates which are relatively close together. In FIG. 8D, the y-axis coordinate obtained from group No. 11 is likewise deviant. In FIG. 8C, the z-axis positions are well grouped together and no deviant point can be seen. The deviant points are circled.

This is merely an example, and in other cases the number of deviant points obtained could be greater or smaller.

By analyzing the makeup of group No. 11 (detectors Nos. 3, 52, and 82) and group No. 14 (detectors Nos. 5, 8, and 52), it can be seen that acoustic detector No. 52 is common to both groups. It would appear to be the cause of the detected deviant results.

If all groups that contain detector No. 52 are eliminated, then the accuracy of the approximate positions will be improved.

FIG. 9 shows a table similar to the table of FIG. 7 but from which groups containing detector No. 52 have been eliminated. These are groups Nos. 6, 7, 10, 11, 12, and 14.

Measurement precision is improved as demonstrated by the parameter SEP which has gone from 128.4 mm prior to eliminating the groups containing detector No. 52 (the table of FIG. 7) to 85.1 mm after eliminating the groups that contain detector No. 52 (the table of FIG. 9).

The following two steps continue to be performed so long as the parameter SEP remains greater than a predetermined value.

Starting from the table of FIG. 9, it can be seen that groups 1, 3, 4, and 5 lead to deviant x-axis coordinates. The cause is acoustic detector No. 1 which is to be found in each of the groups identified.

If the groups including acoustic detector No. 1 are eliminated, then precision in localizing the source of partial discharge will be improved.

The table of FIG. 10 is similar to the table of FIG. 9, showing the approximate positions of the source of partial discharge as seen by the groups that remain after eliminating acoustic detector No. 1. Groups Nos. 1, 2, 3, 4, and 5 have been eliminated. There remain only U groups of acoustic detectors to be taken into consideration where U<T. The parameter SEP is now 56.0 mm. It is assumed that the predetermined value for the parameter SEP was 56.0 mm. This value has been achieved. So the two steps are no longer performed. An improvement in accuracy of about 230% has been obtained between the results contained in the table of FIG. 7 and those contained in the table of FIG. 10.

It is now possible to calculate the looked-for position of the source of partial discharge. The last step consists in calculating the looked-for position of the source of partial discharge using the approximate positions calculated for all or some of the triplets that have not been eliminated at the end of the last check to be performed (block 44). This is either the second check, or the additional check, or the supplementary check.

This calculation is performed merely by taking the average of the saved approximate positions. The looked-for position as calculated in this way thus corresponds to the center of gravity of the set of approximate positions used in calculating the average.

Figure 5A:
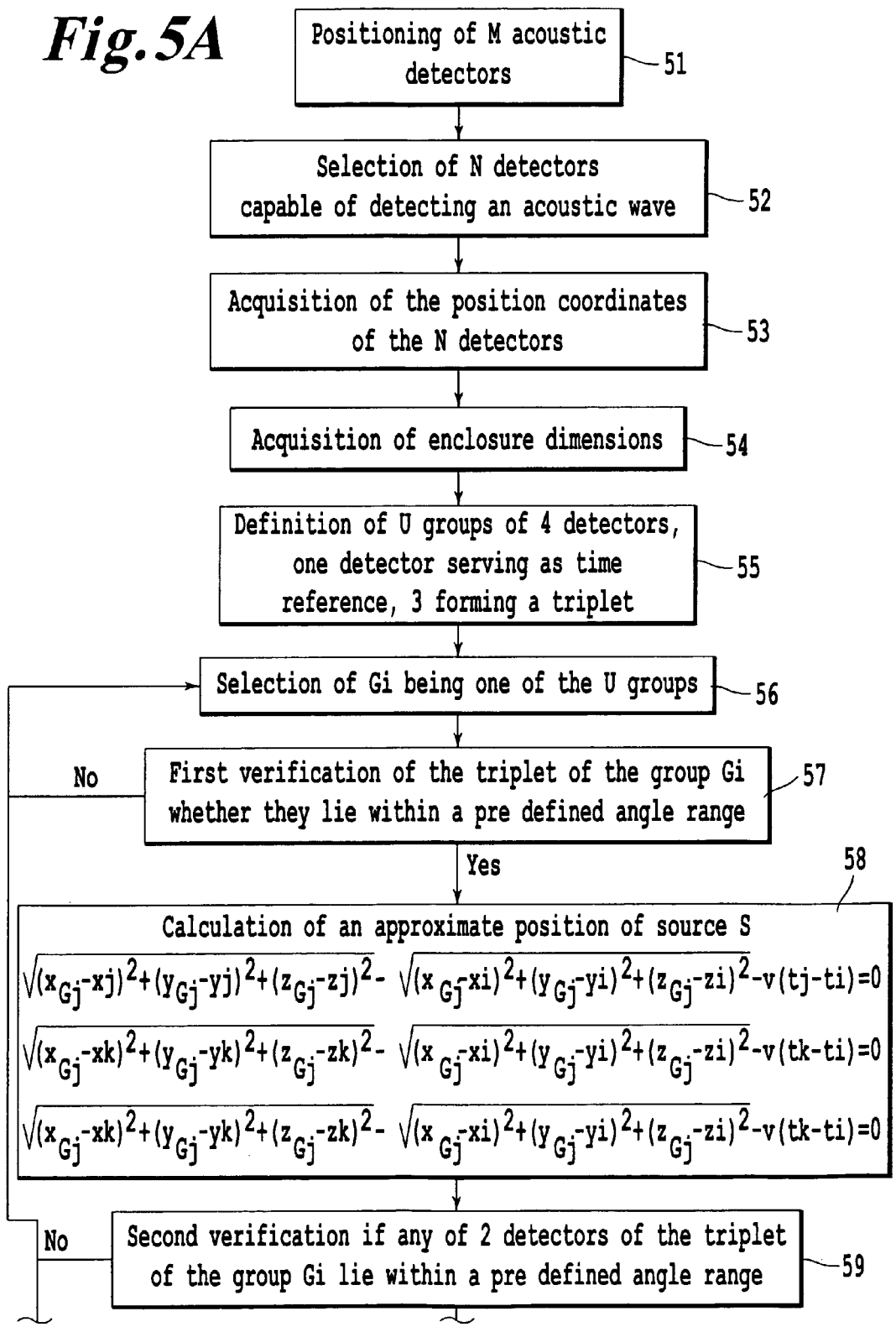
FIGS. 5A to 5B show another example of the method of the invention in the form of a flow chart.
Figure 5B:
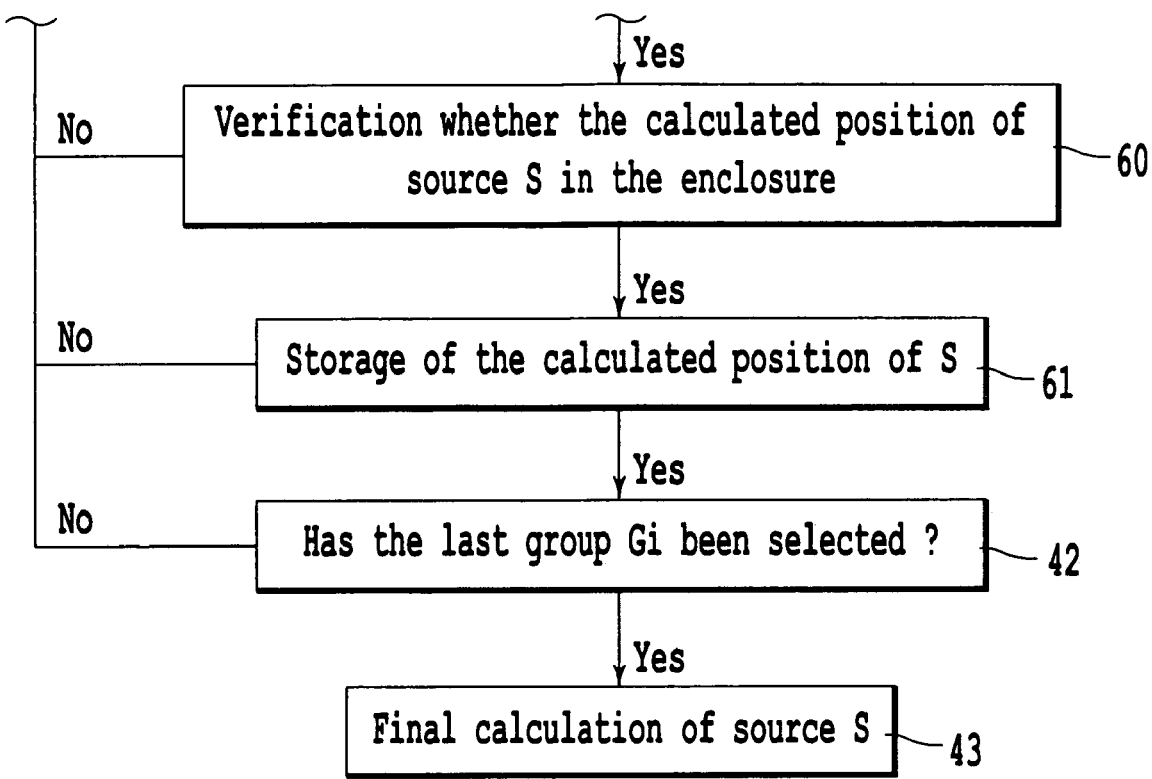

Reference is now made to FIGS. 5A and 5B while describing a second variant of the method of the invention.

Blocks 51 to 54 are similar to blocks 31 to 34 of FIG. 4A. The main difference lies in block 55 which differs from block 35 of FIG. 4A. Furthermore, the search for detectors leading to deviant approximate positions is not performed. Naturally, it is entirely possible to proceed in the same manner as described for block 43 of FIG. 4A.

In block 55, V groups G1 to GV of four acoustic detectors are defined. These groups are quadruplets. A group Gj comprises an acoustic detector which serves as a time reference, e.g. $5_7$ associated with a triplet of acoustic detectors $5_4$, $5_5$, $5_6$ which serve as geometrical references. The acoustic detector which serves as a time reference is any one of the N acoustic detectors. The three acoustic detectors which serve as geometrical references are selected from the set of the N−1 remaining acoustic detectors. V is an integer equal to (N−1)!/3!(N−4)!, which corresponds to the number of combinations of three acoustic detectors that can be taken from the set of the remaining N−1 acoustic detectors.

In block 56, one of the groups Gj is selected from the V groups.

Thereafter, in block 57, a first check is performed concerning the selected group (quadruplet) Gj (where j lies in the range 1 to V). This check is to verify that the four triangles defined by the four acoustic detectors of the selected quadruplet have all of their angles satisfying a predetermined condition, i.e. that these angles lie in a predetermined range of angles. This range of angles preferably extends from 30° to 151°, end values included. If the selected quadruplet does not satisfy this angle condition, it is eliminated. Thereafter, another quadruplet is selected and subjected to the first check.

This first check is thus performed in succession for each of the V quadruplets. After the first check, it is assumed that there remain only W quadruplets G1 to GW to be taken into consideration where W≦V and where V−W quadruplets has been eliminated.

When a quadruplet satisfies the angle condition, i.e. when all of the angles in each of the four triangles embodied by any three acoustic detectors of the quadruplets lie within the range of angles, then in block 58, an approximate position $(x_{Gj}, y_{Gj}, z_{Gj})$ is calculated for the source S of partial discharge, as seen by the selected quadruplet Gj of detectors, on the basis of the positions of the acoustic detectors in the selected quadruplet and on the basis of the instants at which the acoustic wave emitted by the source of partial discharge is received by each of the acoustic detectors of the quadruplet.

More precisely, this is done by solving by optimization the following system of equations in four unknowns:

$$\sqrt{(x_{Gj}-xj)^2+(y_{Gj}-yj)^2+(z_{Gj}-zj)^2} - \sqrt{(x_{Gj}-xi)^2+(y_{Gj}-yi)^2+(z_{Gj}-zi)^2} - v(tj-ti)=0$$

$$\sqrt{(x_{Gj}-xk)^2+(y_{Gj}-yk)^2+(z_{Gj}-zk)^2} - \sqrt{(x_{Gj}-xi)^2+(y_{Gj}-yi)^2+(z_{Gj}-zi)^2} - v(tk-ti)=0$$

$$\sqrt{(x_{Gj}-xl)^2+(y_{Gj}-yl)^2+(z_{Gj}-zl)^2} - \sqrt{(x_{Gj}-xi)^2+(y_{Gj}-yi)^2+(z_{Gj}-zi)^2} - v(tl-ti)=0$$

where:
- (xi, yi, zi), (xj, yj, zj), (xk, yk, zk), (xl, yl, zl) represent the positions of the four acoustic detectors of the selected quadruplet Gy, v is the speed of the acoustic wave in the fluid, and ti, tj, tk, and tl are the instants at which the same acoustic wave emitted by the partial discharge is received by each of the acoustic detectors of the selected quadruplet Gj. In this example, it is assumed that the detector whose coordinates are xi, yi, and zi serves as the time reference. Some other selection could naturally have been made.

In block 59, a second check is performed to verify that in each of the W quadruplets G1 to GW, i.e. the quadruplets that have not eliminated by the first check, that the six triangles with vertices embodied by two of the detectors of the quadruplet and by the approximate position of the source of partial discharge as previously calculated all have angles that lie in the predetermined angle range.

If a quadruplet does not satisfy this angle condition, it is eliminated. At the end of this step, when the W quadruplets that have not been eliminated at the end of the first check have all been subjected to the second check, there remain X quadruplets where X≦W.

At this stage, the approximate positions of the source S of partial discharge as calculated from the X quadruplets that have not been eliminated by the end of the second check can be saved in a memory of the calculation means.

Nevertheless, it is preferable to begin by performing an additional check which consists in ensuring that the approximate positions of the source of partial discharge as calculated in block 60 for the X quadruplets that are not eliminated at the end of the second check do indeed lie within the enclosure 1 of the electrical apparatus. This check may be performed by making a comparison with the dimensions of the enclosure as acquired in block 54. A certain amount of tolerance can be allowed for as mentioned above.

Any quadruplet Gj that has led to a position for the source of partial discharge lying outside the enclosure is eliminated. At the end of this additional check, there remain Y quadruplets of acoustic detectors with Y≦X.

This additional check further improves the accuracy with which the source of partial discharge is localized.

In this case, the approximate positions of the source of partial discharge as calculated from the Y quadruplets that are not eliminated at the end of the additional check are saved in block 61.

The position saved might be the approximate positions of the source of discharge as calculated from the X quadruplets that were not eliminated at the end of the second check if the additional check is omitted.

In block 62, a check is made to verify whether the calculation has terminated, i.e. whether the current group is the last selected group since all of the other groups have already been analyzed.

The last step is to calculate the looked-for position of the source of partial discharge using the approximate positions calculated for all or some of the quadruplets that are not eliminated at the end of the second check or at the end of the additional check if it is performed. This calculation may be performed as above on the basis of the approximate positions stored in the memory, merely by taking the average.

If provision is made to perform the supplementary check described in block 43 of FIG. 4A, this check is performed prior to calculating the looked-for position of the source of partial discharge.

In this example, it is assumed in block 63 that the looked-for position of the source of partial discharge is calculated merely by taking the average of the approximate positions obtained from the Y groups of acoustic detectors that were not eliminated at the end of the supplementary check.

This second variant leads to accuracy that is better than that obtained with the first variant since the inaccuracy induced by detecting the high frequency or ultra-high frequency wave is not included.

The additional check and the supplementary check further increase the accuracy of localization.

FIG. 11 is a table summarizing the simulated and experimental results for the position of the source of partial discharge and the corresponding errors obtained by both variants of the method of the invention and by a method known under the name R. Bucher which is the traditional triangular method. The error corresponds to the distance between the position of the simulated or experimental source and its true position which is known. The errors were 0 for both variants (simulated positions) and 49 mm for the first variant and 12.7 mm for the second variant (experimental positions), whereas they were respectively 151 mm and 240 mm using the R. Bucher method.

Although variant embodiments of the present invention have been shown and described in detail, it will be understood that various changes and modifications can be applied thereto without going beyond the ambit of the invention.

BIBLIOGRAPHY

[1] "Partial discharge ultrasonic wave propagation in steel transformer tanks" Phung Janmes, Blackburn Su, 7th International Symposium on High Voltage Engineering, Tehnische Universität Dresden, Aug. 26–30, 1991, pages 131–134.
[2] U.S. Pat. No. 3,622,872.
[3] Patent application WO 94/28566.
[4] Patent application WO 01/18554.
[5] U.S. Pat. No. 4,095,173.
[6] Patent application EP 0 518 508.
[7] Patent application WO 97/24742.
[8] Patent application WO 96/18112.
[9] U.S. Pat. No. 3,728,619.
[10] Patent application FR 2 304 088.

The invention claimed is:

1. A method of detecting and localizing a source of partial discharge in an electrical apparatus placed in an enclosure including an acoustically-conductive fluid, the method including:
   positioning against the outside of the enclosure N acoustic detectors configured to detect an acoustic wave emitted by the source of partial discharge, and acquiring positions of the N acoustic detectors;
   defining P groups of acoustic detectors from the N acoustic detectors with $P=Z!/3!(Z-3)!$, each of the P groups comprising at least three detectors, and Z being equal to N or to N–1;
   performing a first check to verify whether each group is free from any triangle having vertices embodied by three acoustic detectors in which at least one angle lies outside a range of angles, and otherwise eliminating the group;
   first calculating an approximate position for the source of partial discharge, for each group that is not eliminated after the performing the first check, from the positions of the acoustic detectors of the group and the instants the acoustic wave emitted by the source of partial discharge is received by each of the detectors of the group;
   performing a second check to verify whether that each group that is not eliminated after the performing the first check is free from any triangle having vertices embodied by two of the detectors of the group and by the approximate position of the source of partial discharge with at least one angle lying outside the range, and otherwise eliminating the group; and
   second calculating the looked-for position of the source of partial discharge by averaging the approximate positions calculated for the at least one group that are not eliminated after the second check.

2. The method according to claim 1, wherein the range of angles extends from 30° to 151° (end values included).

3. The method according to claim 1 or claim 2, the method further comprising:
   acquiring the dimensions of the enclosure; and
   performing a third check to verify whether the approximate position of the source of partial discharge, as calculated for the at least one group that is not eliminated after the second check, lies inside the enclosure of the apparatus, and otherwise eliminating the group.

4. The method according to claim 3, wherein the performing the third check is performed with a tolerance.

5. The method according to claim 3, wherein an average is computed using the approximate position calculated for at least one group that is not eliminated after the performing the third check.

6. The method according to claim 1, wherein the method further includes:
   performing a fourth check to eliminate at least one acoustic detector that has led to at least one approximate position considered deviant.

7. The method according to claim 6, wherein the fourth check includes:
   first identifying at least one extreme approximate position from the approximate positions for the source of partial discharge as calculated for at least one group that is not eliminated after the fourth check;
   second identifying at least one acoustic detector at the origin of the at least one extreme approximate position;
   eliminating any group of acoustic detectors that include the identified acoustic detector; and
   repeating said first and second identifying so long as a spherical error probability (SEP) parameter calculated from the at least one approximate position for the source of partial discharge from the non-eliminated groups remains greater than a threshold value.

8. The method according to claim 7, wherein the SEP parameter is defined by $SEP=0.513\ (\sigma_x+\sigma_y+\sigma_z)$, and
   $\sigma_x$ is the standard deviation along the x-axis for the approximate positions of the source of partial discharge,
   $\sigma_y$ is the standard deviation along the y-axis of the approximate positions for the source of partial discharge, and
   $\sigma_z$ is the standard deviation along the z-axis of the approximate positions for the source of partial discharge.

9. The method according to claim 6, wherein the average is computed using the approximate positions calculated for all groups that are not eliminated after the fourth check.

10. The method according to claim 1, wherein the method further includes:
    applying M acoustic detectors to the outside wall of the enclosure of an electrical apparatus, and
    selecting amongst the M acoustic detectors, N acoustic detectors suitable for detecting an acoustic wave emitted by the source of partial discharge.

11. The method according to claim 1, wherein when Z=N, a group is formed from a triplet of acoustic detectors, with the approximate positions being calculated by triangulation, by solving the following equations:

$$(x_{Gi}-xi)^2+(y_{Gi}-yi)^2+(Z_{Gi}-zi)^2-v^2(ti-t0)^2=0$$

$$(x_{Gi}-xj)^2+(y_{Gi}-yj)^2+(z_{Gi}-zj)^2-v^2(tj-t0)^2=0$$

$$(x_{Gi}-xk)^2+(y_{Gi}-yk)^{2+}(z_{Gi}-zk)^2-v^2(tk-t0)^2=0, \text{wherein}$$

$X_{Gi}$, $y_{Gi}$, $Z_{Gi}$ represent the approximate position of the source of partial discharge, (xi, yi, zi), (xj, yj, zj), (xk, yk, zk) represent the positions of the acoustic detectors of the triplet, t0 represents an instant at which a partial discharge generated by the source is emitted, and ti, tj, tk represent the instants at which the acoustic wave emitted by the partial discharge is picked up by each of the acoustic detectors of the triplet, and v represents the speed of the acoustic wave in the fluid.

12. The method according to claim 11, wherein the instants of the emission of the partial discharge is measured by electrical means which co-operates with the enclosure.

13. The method according to claim 1, wherein Z=N−1, a group is formed by a quadruplet of acoustic detectors including one acoustic detector that acts as a time reference, the approximate positions being calculated by triangulation by solving the following equations:

$$\sqrt{(x_{Gj}-xj)^2+(y_{Gj}-yj)^2+(z_{Gj}-zj)^2} - \sqrt{(x_{Gj}-xi)^2+(y_{Gj}-yi)^2+(z_{Gj}-zi)^2} - v(tj-ti)=0$$

$$\sqrt{(x_{Gj}-xk)^2+(y_{Gj}-yk)^2+(z_{Gj}-zk)^2} - \sqrt{(x_{Gj}-xi)^2+(y_{Gj}-yi)^2+(z_{Gj}-zi)^2} - v(tk-ti)=0$$

$$\sqrt{(x_{Gj}-xl)^2+(y_{Gj}-yl)^2+(z_{Gj}-zl)^2} - \sqrt{(x_{Gj}-xi)^2+(y_{Gj}-yi)^2+(z_{Gj}-zi)^2} - v(tl-ti)=0,$$

wherein $x_{Gj}$, $y_{Gj}$, $z_{Gj}$ represent the approximate position of the source of partial discharge, (xi, yi, zi), (xj, yj, zj), (xk, yk, zk), (xl, yl, zl) represent the positions of the four acoustic detectors of the quadruplets, ti, tj, tk, tl represent the instants at which the acoustic wave emitted by the partial discharge is received by each of the acoustic detectors of the quadruplet, and v is the speed of the acoustic wave in the fluid.

14. The method according to claim 11, wherein the electrical means is an antenna detector.

* * * * *